United States Patent
Al-Dahle et al.

(10) Patent No.: US 9,553,578 B2
(45) Date of Patent: Jan. 24, 2017

(54) TRANSISTOR SWITCH HAVING CONSTANT ON RESISTANCE WITH INPUT SIGNAL WITH HAVING VARIABLE VOLTAGE COMPONENT

(71) Applicant: APPLE INC., Cupertino, CA (US)

(72) Inventors: Ahmad Al-Dahle, Santa Clara, CA (US); Hyunwoo Nho, Stanford, CA (US); Marduke Yousefpor, Cupertino, CA (US); Weijun Yao, San Jose, CA (US); Yingxuan Li, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 148 days.

(21) Appl. No.: 14/502,899

(22) Filed: Sep. 30, 2014

(65) Prior Publication Data

US 2016/0094219 A1  Mar. 31, 2016

(51) Int. Cl.

| | |
|---|---|
| *G05F 1/10* | (2006.01) |
| *H03K 17/687* | (2006.01) |
| *G09G 3/36* | (2006.01) |
| *G09G 3/20* | (2006.01) |
| *H03K 17/14* | (2006.01) |

(52) U.S. Cl.
CPC ............ *H03K 17/6872* (2013.01); *G09G 3/20* (2013.01); *G09G 3/3696* (2013.01); *H03K 17/145* (2013.01); *H03K 17/687* (2013.01); *G09G 2300/08* (2013.01); *H03K 2217/0054* (2013.01)

(58) Field of Classification Search
CPC .................................................. H03K 17/6872
See application file for complete search history.

(56) References Cited

U.S. PATENT DOCUMENTS

| | | | |
|---|---|---|---|
| 6,956,411 B1 | 10/2005 | Holloway | |
| 7,782,117 B2 * | 8/2010 | Stultz | H03K 17/145 327/389 |
| RE41,728 E | 9/2010 | Mariani | |

(Continued)

OTHER PUBLICATIONS

Xin Jing et al.; "A power-efficient 12-bit analog-to-digital converter with a novel constant-resistance CMOS input sampling switch"; Journal of Semiconductors, vol. 35, No. 2; Feb. 2014; 10 pgs.; http://www.jos.ac.cn/bdtxben/ch/reader/create_pdf.aspx?file_no=13091002.

*Primary Examiner* — Hai L Nguyen

(74) *Attorney, Agent, or Firm* — Fletcher Yoder PC

(57) ABSTRACT

Systems, methods, and devices to control a transistor to maintain one or more substantially constant characteristics while activated or deactivated are provided. One such system includes a transistor that receives an activation signal on a gate terminal to become activated during a first period and receives a deactivation signal on the gate terminal to become deactivated during a second period. The transistor receives an input signal on an input terminal during the first period and the second period. The input signal varies during the first period and during the second period. The transistor may have improved reliability (e.g., substantially constant on resistance $R_{ON}$) because a first difference between the input signal and the activation signal substantially does not vary during the first period and a second difference between the input signal and the deactivation signal substantially does not vary during the second period.

19 Claims, 11 Drawing Sheets

(56) References Cited

U.S. PATENT DOCUMENTS

| | | | |
|---|---|---|---|
| 7,950,292 B2 | 5/2011 | Harada et al. | |
| 8,330,523 B2 * | 12/2012 | Gagne | H03K 17/145 327/378 |
| 8,779,839 B2 * | 7/2014 | Snowdon | H03K 17/6874 327/419 |

* cited by examiner

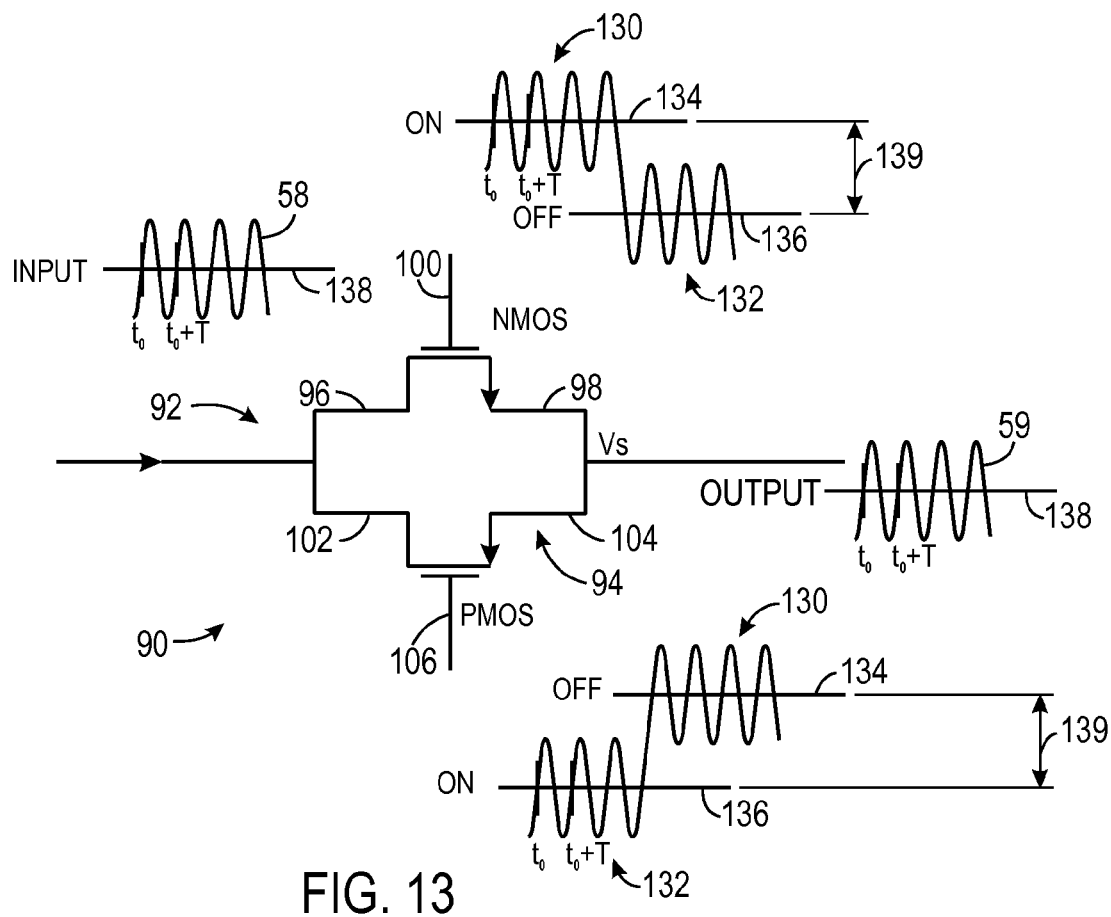
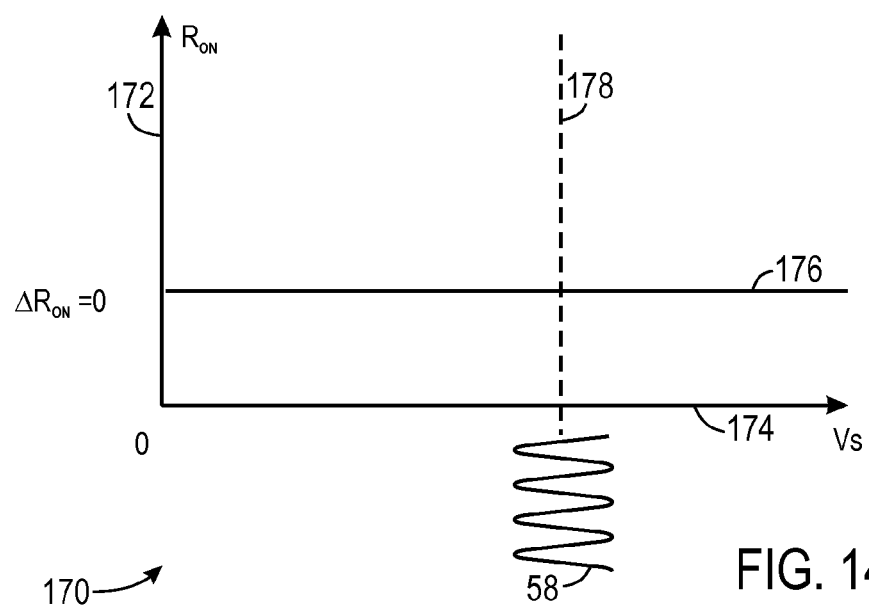
FIG. 13
FIG. 14

# TRANSISTOR SWITCH HAVING CONSTANT ON RESISTANCE WITH INPUT SIGNAL WITH HAVING VARIABLE VOLTAGE COMPONENT

BACKGROUND

This disclosure relates to a transistor switch that maintains a substantially constant on resistance when passing an input signal that includes a variable voltage component (e.g., an alternating current (AC) component).

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many integrated circuits use switches formed using transistors to allow a signal to pass through the switch to be received by other circuitry. Generally speaking, the lower the amount of signal distortion in the circuitry of an electronic device, the greater the reliability of the circuitry. On an electronic display panel, for example, thin film transistors may switch a variety of input signals to operate the display. In general, these signals include substantially only a direct current component. When the transistor switches are used to pass only direct current input signals, the transistor switches may keep a substantially constant "on resistance," or $R_{ON}$, which is the resistance of the transistor switch when the transistor switch is on. By maintaining a substantially on resistance $R_{ON}$, the transistor switches generally may not distort these direct current input signals.

The on resistance $R_{ON}$ of transistor switches may vary, however, when the input signals include a variable voltage component that varies over time. When the input signals include a sinusoidal or other alternating current component, the on resistance $R_{ON}$ of the transistor switches may vary over time. The resulting output signals may be non-linear, unreliable, and/or high in noise. Moreover, transistors formed as circuit-on-glass devices made from polysilicon may exhibit even greater variability of on resistance $R_{ON}$. As a result, sending a signal that includes a variable voltage component through a transistor switch—particularly one formed as a circuit-on-glass device—may produce an unreliable output signal. Although increasing a size of the transistor may reduce the variability of the on resistance $R_{ON}$, a larger transistor takes up more integrated circuit die space. The comparatively larger size of the transistor may crowd out other possible circuitry on the integrated circuit die and/or may add to the design cost. A larger transistor may also consume more energy, lowering the potential battery life of electronic devices that would include the larger transistor. Moreover, given design constraints, making a transistor that is large enough to completely eliminate the on resistance $R_{ON}$ variability may be difficult or impractical.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

To avoid the increased distortion that can arise when input signals having variable voltage components are passed through a transistor, the disclosure describes systems and methods for controlling a transistor to maintain a more constant on resistance $R_{ON}$. Electronic devices such as handheld devices, tablets, computers, and electronic displays that use the systems and methods of this disclosure may have more reliable signal quality and, as a result, may themselves be more reliable and/or more power efficient. In particular, the on resistance $R_{ON}$ of the transistor switches may be made substantially uniform, even when an input signal with a variable voltage component is applied to the transistor, by adding the same variable voltage component to the gate activation and gate deactivation signals. It is believed that the on resistance $R_{ON}$ of a transistor depends on the voltage difference between the input (source) terminal of the transistor and the gate terminal of the transistor. By adding the variable voltage component of the input signal to the gate activation and gate deactivation signals, the variable voltage components on the input (source) terminal and the gate terminal may cancel each other out. This leaves substantially only a direct current (DC) voltage difference between the input (source) terminal and the gate terminal.

Thus, maintaining a DC voltage difference between the input (source) terminal and the gate terminal in this way keeps the on resistance $R_{ON}$ substantially constant while the input (source) signal is passed through the transistor. Moreover, as mentioned above, the variable voltage component may be added to the gate deactivation signal as well. This may prevent a voltage swing in the input signal from inadvertently activating the transistor when the transistor should be controlled to be off, which could occur if the gate deactivation signal were merely a direct current voltage value.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which:

FIG. 13 is a circuit diagram illustrating a manner of maintaining a substantially constant on resistance $R_{ON}$ of the CMOS transistor switch by supplying gate terminals of the transistor switch with gate activation-deactivation signals that include the same variable voltage component as the input signal, in accordance with an embodiment;

FIG. 14 is a plot of the on resistance $R_{ON}$ of the CMOS transistor under the conditions of FIG. 13, in accordance with an embodiment;

DETAILED DESCRIPTION

Figure 1:
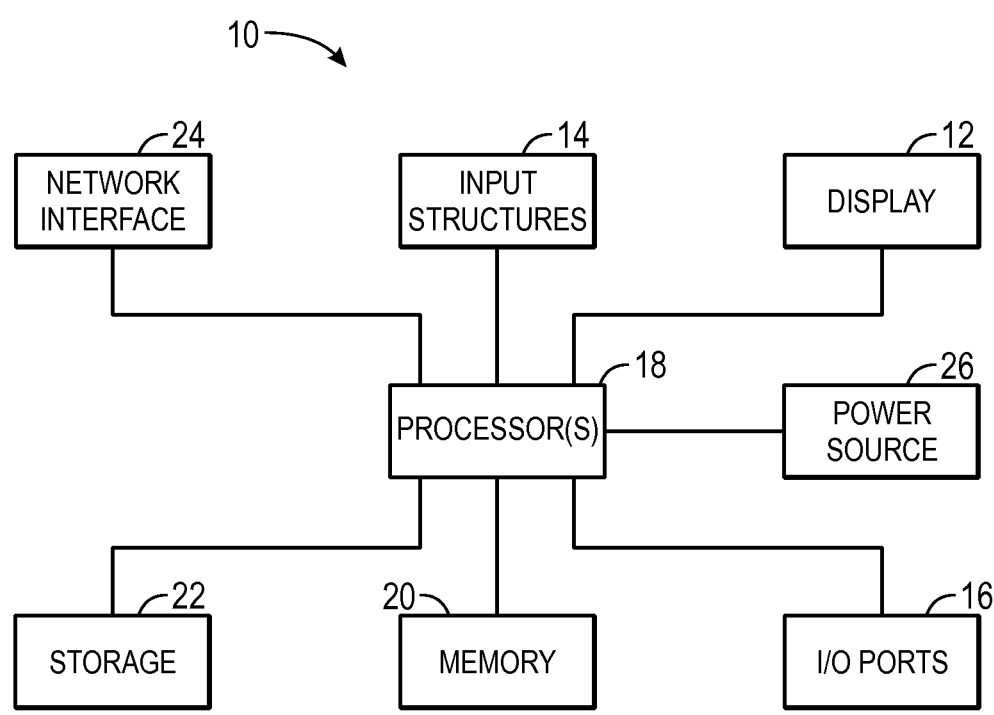
FIG. 1 is a block diagram of a system that uses transistor switches that maintain a substantially constant on resistance $R_{ON}$ while passing a signal having a variable voltage component, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

A variety of devices may use transistors, such as MOSFETs, to act as switches to allow or disallow an input signal to pass through the transistor. For example, a display panel of a liquid crystal display (LCD) or an organic light emitting diode (OLED) display may have many thin film transistor (TFT) switches patterned on a glass substrate. This type of circuitry is often referred to as circuit-on-glass (COG) circuitry. Transistor switches in a display panel may switch a variety of different signals through various parts of the display panel (e.g., to display images). Numerous other types of electronic devices may also use transistor switches to route various signals.

In general, a transistor can act as a switch in the following way. A transistor includes at least three terminals: a source terminal (in general, the input terminal), a drain terminal (in general, the output terminal), and a gate terminal. Whether the transistor switch allows or disallows an input signal to pass depends on a voltage difference between (1) the input signal on the source terminal and (2) a gate activation-deactivation signal on the gate terminal. For a type of transistor known as an NMOS transistor, when the voltage difference between the gate terminal and the source terminal of the NMOS transistor is sufficiently high, the transistor switches "ON" and allows the input signal to pass through a "channel" that forms in the transistor between the source terminal and the drain terminal. When the voltage difference between the gate terminal and the source terminal of the NMOS transistor is sufficiently low, the transistor switches "OFF" and prevents the input signal from passing. The opposite configuration is true for a type of transistor known as a PMOS transistor. That is, when the voltage difference between the gate terminal and the source terminal of the PMOS transistor is sufficiently low, the transistor switches "ON" and allows the input signal to pass through a "channel" that forms in the transistor between the source terminal and the drain terminal. When the voltage difference between the gate terminal and the source terminal of the PMOS transistor is sufficiently high, the transistor switches "OFF" and prevents the input signal from passing. A transistor switch may include at least one NMOS transistor, at least one PMOS transistor, and/or at least one complementary pair of NMOS and PMOS transistors. In the latter case, a complementary pair of NMOS and PMOS transistors is referred to as a complementary-MOS (CMOS) transistor switch.

When a transistor switch is activated, the channel that forms between the source (input) terminal and drain (output) terminal may have characteristics that vary depending on the voltage difference between the gate terminal and source terminal (input). An input signal with substantially only a direct current (DC) voltage component—that is, an input signal that is generally static at least while the transistor switch is active and allowing the input signal to pass—may cause the transistor switch to maintain certain uniform characteristics while allowing the input signal to pass when a uniform gate activation-deactivation signal is applied to the gate terminal. For example, the transistor switch may have a uniform on resistance $R_{ON}$, which is the resistance of the channel while the transistor is in an "ON" state. When the transistor switch maintains a constant on resistance $R_{ON}$, the input signal may pass through the transistor switch and be output on the drain (output) terminal of the transistor switch with relatively little distortion.

Increased distortion, however, can occur with input signals that include not only a direct current (DC) component, but also a variable voltage component (e.g., an alternating current (AC) component). This disclosure will describe systems and methods to maintain a substantially uniform on resistance $R_{ON}$ even with an input signal that includes a variable voltage component. Specifically, the on resistance $R_{ON}$ may be made substantially uniform, even when an input signal with a variable voltage component is applied to the transistor, by adding the same variable voltage component to the gate activation and gate deactivation signals. In this way, only direct current (DC) voltage differences may arise between both the input signal and the gate activation signal and the input signal and the gate deactivation signal. This keeps the on resistance $R_{ON}$ substantially constant while the input (source) signal is passed through the transistor. Adding the variable voltage component to the gate deactivation signal may also prevent a voltage swing in the input signal from inadvertently activating the transistor when the transistor should be controlled to be off, which could occur if the gate deactivation signal were merely a direct current voltage value.

Figure 2:
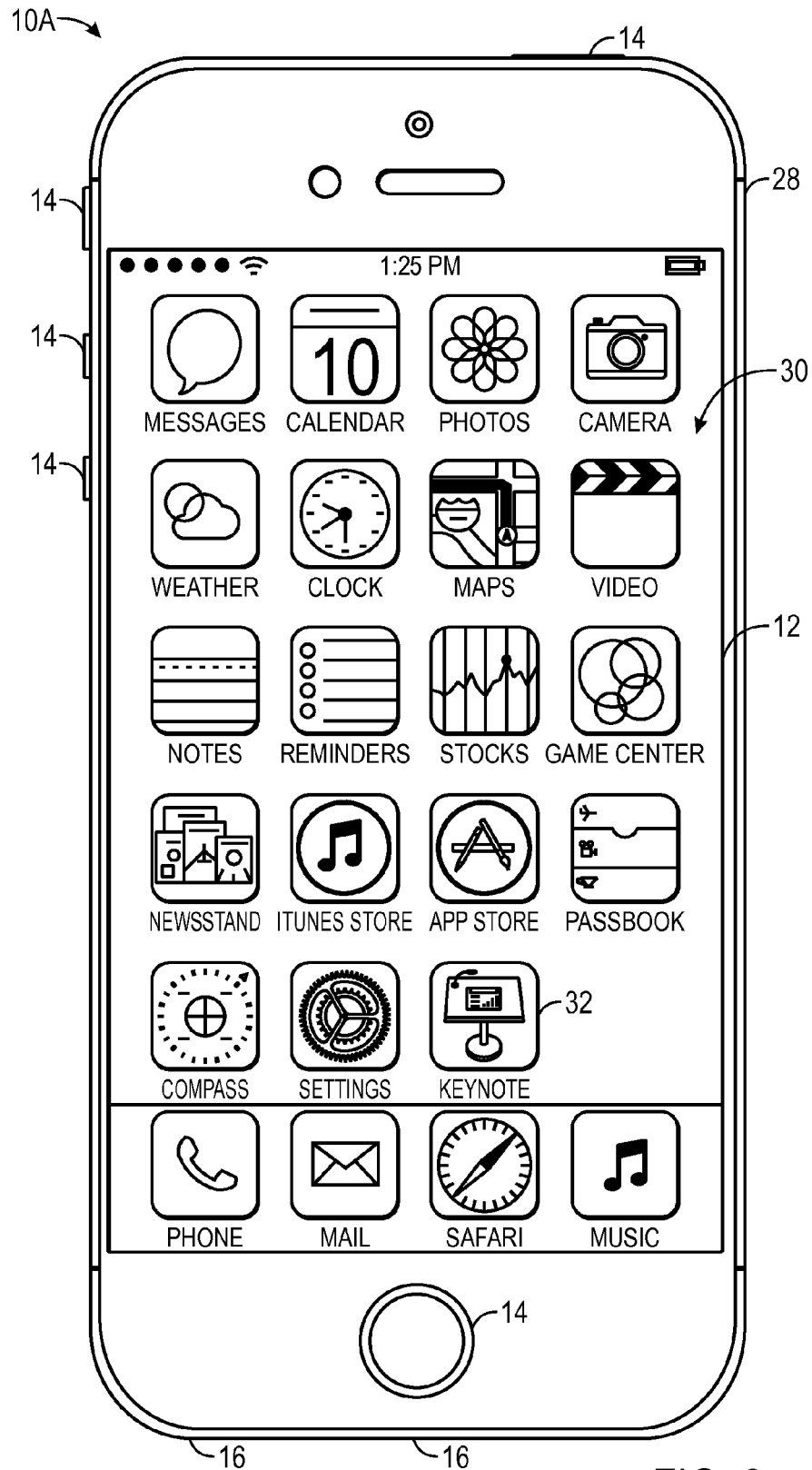
FIG. 2 is a front view of a handheld device that represents one example of the electronic device of FIG. 1.
Figure 3:
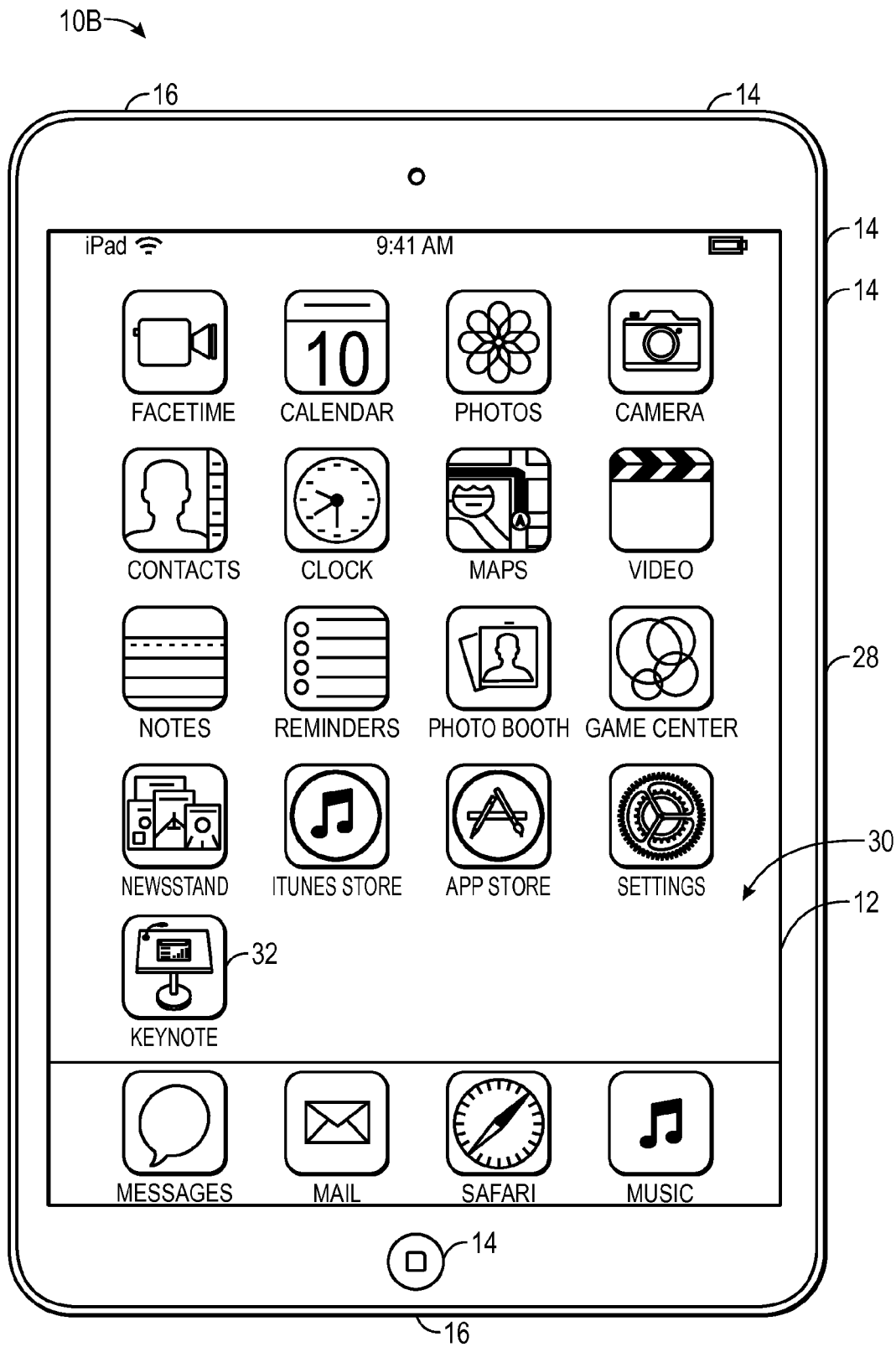
FIG. 3 is a front view of a tablet device that represents another example of the electronic device of FIG. 1.
Figure 4:
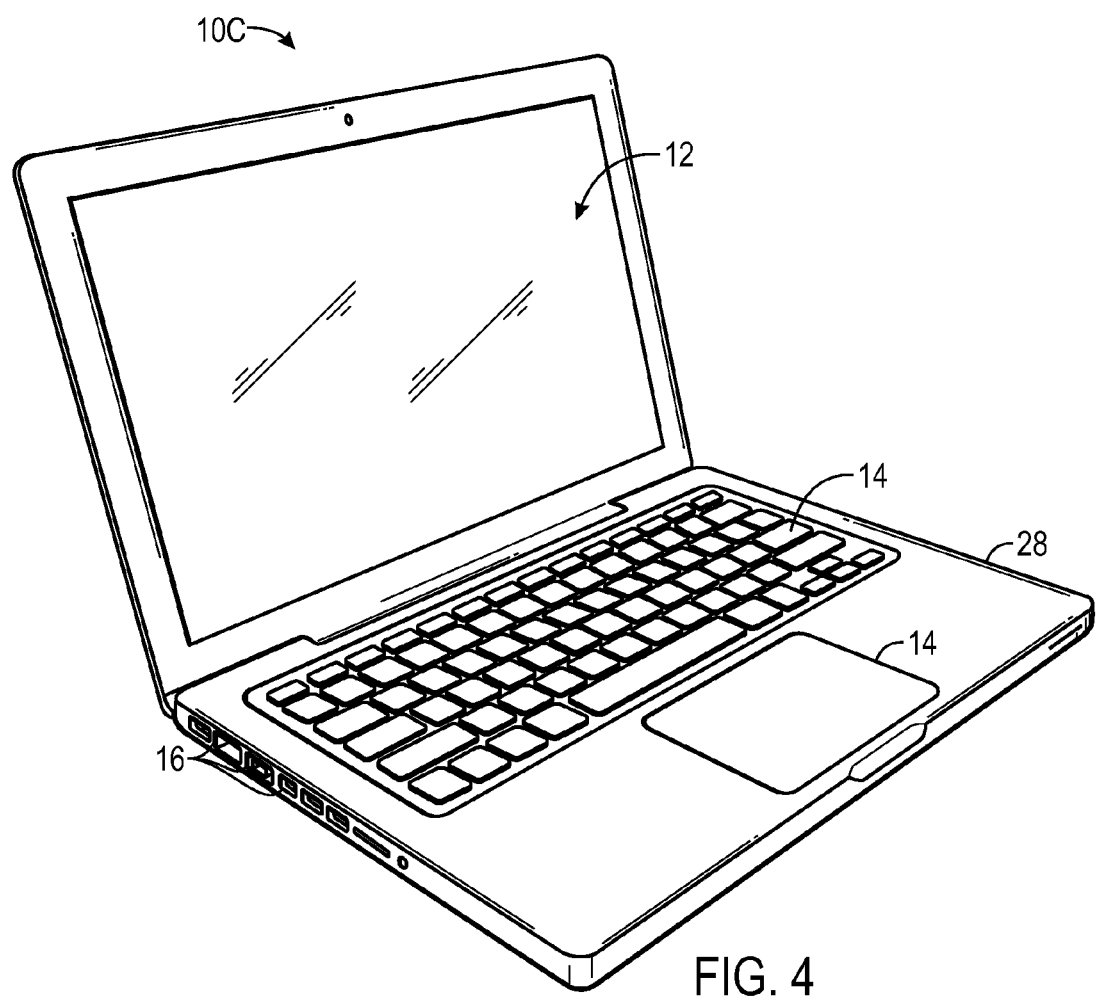
FIG. 4 is a perspective view of a notebook computer that represents another example of the electronic device of FIG. 1.

Transistor switches that maintain a substantially uniform on resistance $R_{ON}$, even for an input signal with a variable voltage component, may appear in a variety of suitable electronic devices. FIG. 1, for example, is a block diagram various components of a suitable electronic device 10. FIGS. 2, 3, and 4 are examples of the electronic device 10. These include a handheld electronic device, a tablet computing device, and a notebook computer, respectively.

Turning first to FIG. 1, the electronic device 10 may include, among other things, an electronic display 12, input structures 14, input/output (I/O) ports 16, one or more processor(s) 18, memory 20, nonvolatile storage 22, a network interface 24, and a power source 26. The various functional blocks shown in FIG. 1 may include hardware elements (including circuitry), software elements (including computer code stored on a non-transitory computer-readable medium) or a combination of both hardware and software elements. It should be noted that FIG. 1 is merely one example of a particular implementation and is intended to illustrate the types of components that may be present in the electronic device 10. Indeed, the various depicted components (e.g., the processor(s) 18) may be separate components (e.g., graphics processing unit, central processing unit, etc.), components of a single contained module (e.g., a system-on-a-chip device), or may be incorporated wholly or partially within any of the other elements within the electronic device 10. The components depicted in FIG. 1 may be embodied wholly or in part as machine-readable instructions (e.g., software or firmware), hardware, or any combination thereof. Any of the components of the electronic device 10, including the electronic display 12, may include transistor switches controlled to maintain a substantially uniform on resistance $R_{ON}$ even while passing an input signal with a variable voltage component.

The electronic device 10 may represent a block diagram of the handheld device depicted in FIG. 2, the tablet computing device depicted in FIG. 3, the notebook computer depicted in FIG. 4, or similar devices, such as desktop computers, televisions, and so forth. In the electronic device 10 of FIG. 1, the display 12 may be any suitable electronic display used to display image data (e.g., a liquid crystal display (LCD) or an organic light emitting diode (OLED) display). In some examples, the display 12 may represent one of the input structures 14, enabling users to interact with a user interface of the electronic device 10. In some embodiments, the electronic display 12 may be a MultiTouch™ display that can detect multiple touches at once. Other input structures 14 of the electronic device 10 may include buttons, keyboards, mice, trackpads, and the like. The I/O ports 16 may enable electronic device 10 to interface with various other electronic devices.

The processor(s) 18 and/or other data processing circuitry may execute instructions and/or operate on data stored in the memory 20 and/or nonvolatile storage 22. The memory 20 and the nonvolatile storage 22 may be any suitable articles of manufacture that include tangible, non-transitory computer-readable media to store the instructions or data, such as random-access memory, read-only memory, rewritable flash memory, hard drives, and optical discs. By way of example, a computer program product containing the instructions may include an operating system (e.g., OS X® or iOS by Apple Inc.) or an application program (e.g., iBooks® by Apple Inc.).

The network interface 24 may include, for example, one or more interfaces for a personal area network (PAN), such as a Bluetooth network, for a local area network (LAN), such as an 802.11x Wi-Fi network, and/or for a wide area network (WAN), such as a 4G or LTE cellular network. The power source 26 of the electronic device 10 may be any suitable source of energy, such as a rechargeable lithium polymer (Li-poly) battery and/or an alternating current (AC) power converter.

As mentioned above, the electronic device 10 may take the form of a computer or other type of electronic device. FIG. 2 depicts a front view of a handheld device 10A, which represents one example of the electronic device 10. The handheld device 10A may represent, for example, a portable phone, a media player, a personal data organizer, a handheld game platform, or any combination of such devices. By way of example, the handheld device 10A may be a model of an iPod® or iPhone® available from Apple Inc. of Cupertino, Calif.

The handheld device 10A may include an enclosure 28 to protect interior components from physical damage and to shield them from electromagnetic interference. The enclosure 28 may surround the display 12, which may display a graphical user interface (GUI) 30 having an array of icons 32. By way of example, one of the icons 32 may launch an application program (e.g iBooks® by Apple Inc.). User input structures 14, in combination with the display 12, may allow a user to control the handheld device 10A. For example, the input structures 14 may activate or deactivate the handheld device 10A, navigate a user interface to a home screen, navigate a user interface to a user-configurable application screen, activate a voice-recognition feature, provide volume control, and toggle between vibrate and ring modes. Touchscreen features of the display 12 of the handheld device 10A may provide a simplified approach to controlling the application programs. The handheld device 10A may include I/O ports 16 that open through the enclosure 28. These I/O ports 16 may include, for example, an audio jack and/or a Lightning® port from Apple Inc. to connect to external devices. The electronic device 10 may also be a tablet device 10B, as illustrated in FIG. 3. For example, the tablet device 10B may be a model of an iPad® available from Apple Inc.

In certain embodiments, the electronic device 10 may take the form of a computer, such as a model of a MacBook®, MacBook® Pro, MacBook Air®, iMac®, Mac® mini, or Mac Pro® available from Apple Inc. By way of example, the electronic device 10, taking the form of a notebook computer 10C, is illustrated in FIG. 4 in accordance with one embodiment of the present disclosure. The depicted computer 10C may include a display 12, input structures 14, I/O ports 16, and a housing 28. In one embodiment, the input structures 14 (e.g., a keyboard and/or touchpad) may be used to interact with the computer 10C, such as to start, control, or operate a GUI or applications (e.g., iBooks® by Apple Inc.) running on the computer 10C.

Figure 5:
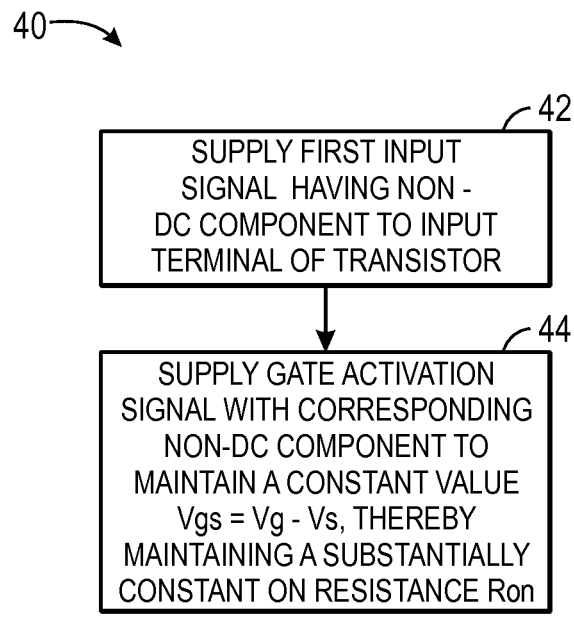
FIG. 5 is a flowchart of a method for driving a transistor switch to maintain a substantially constant on resistance $R_{ON}$ while the transistor switch is passing an input signal with a variable voltage component, in accordance with an embodiment.

The transistor switches may form any suitable parts of the circuitry of the electronic device 10. In general, as shown by a flowchart 40 of FIG. 5, for an input signal having a variable voltage component is passed, a transistor switch may be driven in the following way. Specifically, an input signal having a direct current (DC) voltage component as well as a non-DC voltage component, such as a variable voltage (e.g., alternating current (AC)) component, may be supplied to an input (source) terminal of the transistor switch (block 42). To cause the transistor switch to maintain a substantially constant on resistance $R_{ON}$ when activated, a gate activation-deactivation signal supplied to the gate terminal of the transistor switch may be controlled to maintain a constant direct current (DC) voltage difference between the gate terminal of the voltage and the input signal on the source terminal. That is, the gate activation-deactivation signal may include the same non-DC voltage component as the input signal. As a result, the voltage difference between the gate terminal of the voltage and the input signal on the source terminal may remain substantially constant (e.g., $V_{gs}=V_g-V_s$ may remain constant while the transistor switch is activated or while the transistor switch is deactivated). As will be discussed below, maintaining a constant $V_{gs}$ may cause the on resistance $R_{ON}$ of the transistor to remain substantially constant even as the input signal to the transistor varies over time.

Figure 6:
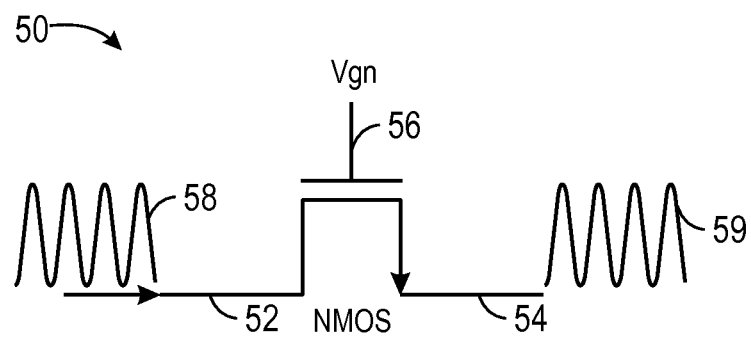
FIG. 6 is a circuit diagram of an NMOS transistor switch that receives an input signal having a variable voltage component, in accordance with an embodiment.

An NMOS transistor 50, represented by a circuit diagram of FIG. 6, may represent one form of transistor switch that can maintain a substantially constant on resistance $R_{ON}$, even when a signal that includes a variable voltage component is passed through it, according to transistor control systems and methods of this disclosure. The NMOS transistor 50 of FIG. 6 includes an input terminal 52, an output terminal 54, and a gate terminal 56. The input terminal 52 receives an input signal 58 that includes a variable voltage component. Although the input terminal 52 is depicted in FIG. 6 to be a drain terminal, and the output terminal 54 is depicted to be a source terminal, it should be appreciated that the NMOS transistor 50, being a MOSFET, is a symmetric device. That is, the source and the drain terminals of the NMOS transistor 50 are interchangeable. Which terminal plays which role depends on which terminal receives the input signal and the voltage value of the gate activation-deactivation signal being applied to the gate terminal 56. In this case, the input terminal 52 receives the input signal 58. Hence, for the purpose of this disclosure (and notwithstanding the particular illustration of FIG. 6 and similar circuitry in other drawings), the input terminal 52 may also be referred to as the source terminal, and the output terminal 54 may also be referred to as the drain terminal.

Based on the voltage values of an NMOS gate activation-deactivation signal $V_{gn}$ supplied to the gate terminal 56, the NMOS transistor 50 may allow or disallow the input signal 58 to pass through the NMOS transistor 50. Specifically, whether the NMOS transistor 50 allows or disallows the input signal 58 to pass depends on a voltage difference between (1) the input signal 58 on the input (source) terminal 52 and (2) the gate activation-deactivation signal $V_{gn}$ on the gate terminal 56. When the voltage difference between the gate terminal 56 and the input (source) terminal 52 of the NMOS transistor 50 is sufficiently high, the NMOS transistor 50 switches "ON" and allows the input signal to pass through a "channel" that forms in the NMOS transistor 50 between the input (source) terminal 52 and the output (drain) terminal 54. When the voltage difference between the gate terminal 56 and the input (source) terminal 52 of the NMOS transistor 50 is sufficiently low, the NMOS transistor 50 switches "OFF" and prevents the input signal 58 from passing. When the NMOS transistor 50 is activated, the input signal 58 may enter the input terminal 52 and be output on the output terminal 54 as an output signal 59.

As an aside, it should be appreciated that PMOS transistors operate in a complementary way to the NMOS transistor 50. That is, when the voltage difference between the gate terminal and the source terminal of a PMOS transistor is sufficiently low, the transistor switches "ON" and allows the input signal to pass through a "channel" that forms in the transistor between the source terminal and the drain terminal. When the voltage difference between the gate terminal and the source terminal of the PMOS transistor is sufficiently high, the transistor switches "OFF" and prevents the input signal from passing.

Returning to the example of the NMOS transistor 50 of FIG. 6, the NMOS transistor 50 may have on resistance $R_{ON}$ characteristics that the systems and methods of this disclosure may employ to maintain a substantially constant on resistance $R_{ON}$ while the NMOS transistor 50 is activated. These on resistance $R_{ON}$ characteristics, as will be described with reference to FIGS. 7 and 8, may cause the NMOS transistor 50 to behave poorly when the gate activation-deactivation signal $V_{gn}$ includes substantially only direct current (DC) voltage components for activation and deactivation, respectively. In certain examples, the NMOS transistor 50 may be a circuit-on-glass (COG) transistor on a display panel of the electronic display 12 and may be based on polysilicon (poly-Si), which may generally exhibit greater on resistance $R_{ON}$ variability than single-crystalline silicon. The NMOS transistor 50 may behave relatively linearly and with relatively low distortion, however, when driven with the gate activation-deactivation signals described further below in this disclosure.

A second-order model of the NMOS transistor 50 may be as follows:

$$I_d = (\mu_n C_{OX})\frac{W}{L}\left[(V_{gs} - V_T)V_{ds} - \frac{1}{2}V_{ds}^2\right], \quad \text{(Equation 1)}$$

where $\mu_n$ represents electron mobility, $C_{OX}$ represents oxide capacitance, W=represents a width of the gate, L represents a length of the gate, Vds represents a drain-to-source voltage (i.e., Vd−Vs), Vgs represents a gate-to-source voltage (i.e., Vgn−Vs), $I_d$ represents the drain current, and $V_T$ represents the transistor threshold voltage.

The on resistance $R_{ON}$, also referred to as resistance drain-to-source, is the resistance of the channel that forms in the NMOS transistor 50 when the NMOS transistor is activated. From the second-order model of the NMOS transistor 50 of Equation 1, the on resistance $R_{ON}$ may be derived by taking the partial derivative of $I_d$ over $V_{ds}$:

$$R_{ON} = \frac{1}{\left(\left(\mu_n C_{OX} \frac{W}{L}\right)(V_{gn} - V_s - V_T)\right)}. \quad \text{(Equation 2)}$$

Figure 7:
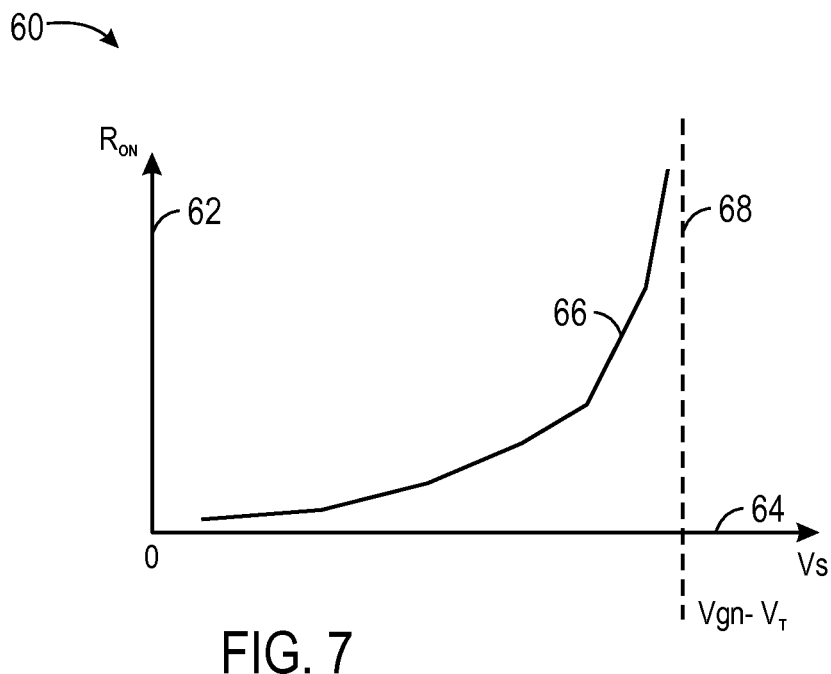
FIG. 7 is a plot comparing the on resistance $R_{ON}$ of the NMOS transistor to the input signal of the NMOS transistor when the NMOS transistor is activated by a direct current activation signal, in accordance with an embodiment.

Using this model of on resistance $R_{ON}$, FIG. 7 illustrates a plot 60 comparing the on resistance $R_{ON}$ of the NMOS transistor 50 (ordinate 62) in relation to an input (source) signal $V_s$ (abscissa 64), given a constant gate activation-deactivation signal $V_{gn}$. As represented by a curve 66, the on resistance $R_{ON}$ increases with changes in the output input (source) signal $V_s$. IN accordance with Equation 2, the on resistance $R_{ON}$ becomes substantially infinite when the input (source) signal $V_s$ exceeds the difference between the gate voltage $V_{gn}$ and the threshold voltage $V_T$ (i.e., $V_{gn}-V_T$). This is shown in FIG. 7 as an asymptote 68, beyond which the on resistance $R_{ON}$ is effectively infinite, and the input (source) signal $V_s$ cannot pass through the NMOS transistor 50.

Figure 8:
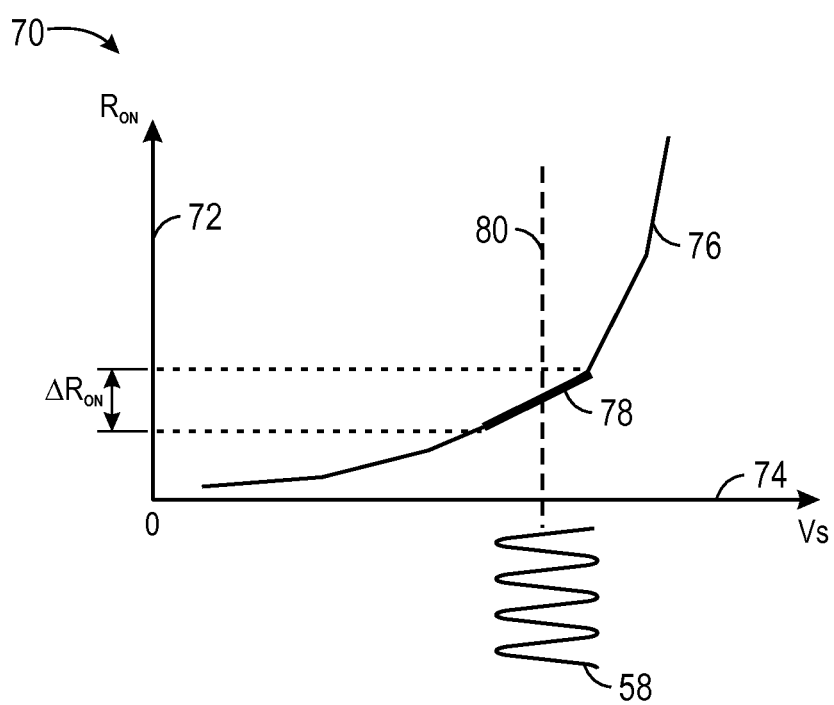
FIG. 8 is a plot illustrating a variability of the on resistance $R_{ON}$ of the NMOS transistor that can result when the NMOS transistor is activated by a direct current activation signal and the input signal has a variable voltage component.

FIG. 8 is a plot 70 that shows the effect of the input (source) signal 58, which has a variable voltage component (e.g., AC component). In the plot 70 of FIG. 8, the on resistance $R_{ON}$ of the NMOS transistor 50 (ordinate 72) is compared to possible values of input (source) signal $V_s$ (abscissa 74) when the gate activation-deactivation signal $V_{gn}$ is constant. Here, because the input (source) signal 58 is changing at least over the time when the NMOS transistor 50 is activated, an on resistance $R_{ON}$ difference ($\Delta R_{ON}$ 78) as the input (source) signal 58 occurs around a direct current voltage component 80.

In other words, when the input (source) signal 58 includes a variable voltage component (e.g., a square wave or sinusoidal wave component) over the period of time that the NMOS transistor 50 is activated, the on resistance $R_{ON}$ of the NMOS transistor 50 will vary. Without further measures, this variable resistance could cause signal distortion including noise folding and harmonics, switch malfunction, poor reliability, and/or poor noise performance. In addition, although increasing a size of the transistor may reduce the variability of the on resistance $R_{on}$, this may be expensive in terms of space on the integrated circuit and/or may lead to higher power consumption. This may be especially true for chip-on-glass (COG) circuitry on a display panel of the display 12, which may have highly limited space availability. A transistor in the display panel of the display 12 may also be formed from polysilicon, which may cause the transistor to have a greater on resistance $R_{ON}$ variability in general. As will be discussed further below, applying a gate activation-deactivation signal that includes the same variable voltage component as the input (source) signal 58 may cause the on resistance $R_{ON}$ to remain substantially constant, which may reduce signal distortion and improve the transistor noise characteristics.

Figure 9:
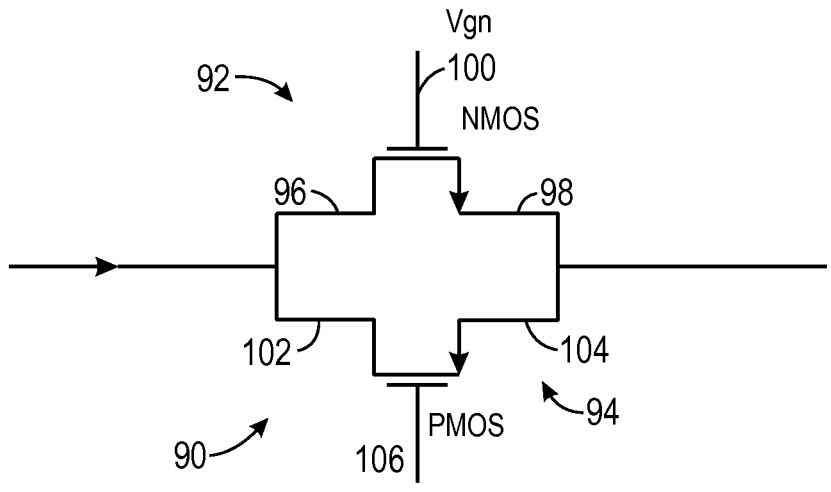
FIG. 9 is a circuit diagram of a CMOS transistor switch that receives an input signal having a variable voltage component, in accordance with an embodiment.

A complementary-MOS (CMOS) transistor switch 90 shown in FIG. 9 may have characteristics related to that of the NMOS transistor 50. The CMOS transistor switch 90 of FIG. 9 includes an NMOS transistor 92 and a PMOS transistor 94 in complementary arrangement. The NMOS transistor 92 has an input (source) terminal 96, an output (drain) terminal 98, and a gate terminal 100. The PMOS transistor 94 likewise has an input (source) terminal 102, an output (drain) terminal 104, and a gate terminal 106. The input (source) signal 58 may pass through the CMOS transistor switch 90 when a sufficiently high gate activation-deactivation signal $V_{gn}$ is applied on the NMOS gate terminal 100 and may pass through the PMOS transistor 94 when a sufficiently low gate activation-deactivation signal $V_{gp}$ is applied on the PMOS gate terminal 106.

Figure 10:
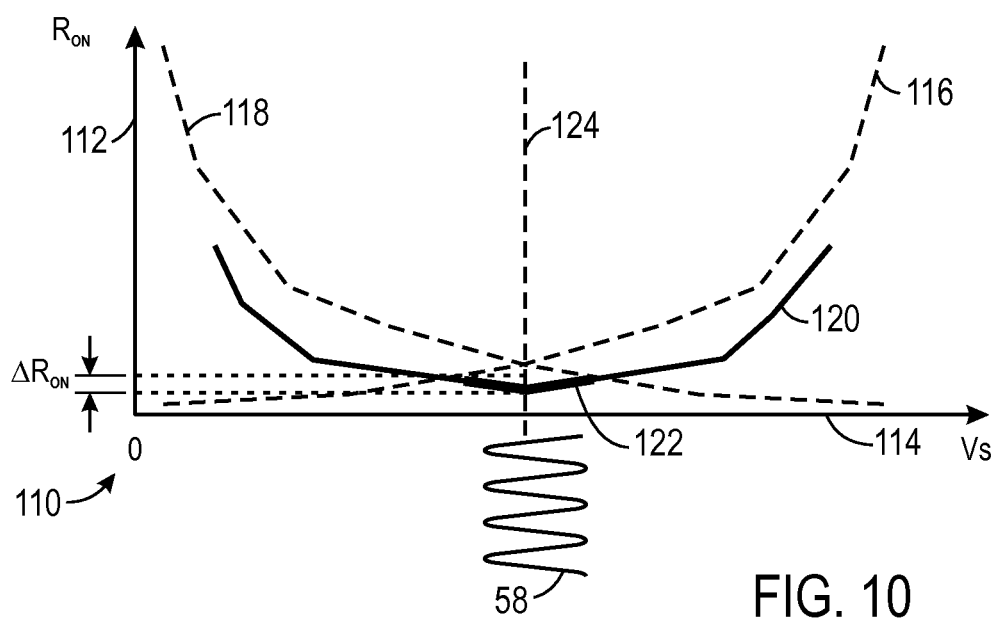
FIG. 10 is a plot illustrating a variability of the on resistance $R_{ON}$ of the CMOS transistor switch that can result when the CMOS transistor switch is activated by a direct current activation signal and the input signal has a variable voltage component.

On resistance $R_{ON}$ characteristics of the CMOS transistor switch 90 are shown in FIG. 10 for the case in which the gate activation-deactivation signals $V_{gn}$ and $V_{gp}$ are constant. In particular, a plot 110 shown in FIG. 10 compares the on resistance $R_{ON}$ of the CMOS transistor switch 90 (ordinate 112) against an input (source) signal $V_s$ (abscissa 114). In the plot 110 of FIG. 10, a first curve 116 represents the change in on resistance $R_{ON}$ in relation to the input (source) signal $V_s$ when the gate activation-deactivation signal $V_{gn}$ applied to the NMOS gate terminal 100 is constant. A second curve 118 represents the on resistance $R_{ON}$ of the PMOS transistor 94 when a constant gate activation-deactivation signal $V_{gp}$ is applied to the PMOS gate terminal 106. Because the NMOS transistor 92 is coupled in parallel to the PMOS transistor 94, the total on resistance $R_{ON}$ is less than each individual resistance and is represented by a third curve 120. When the input (source) signal 58 is applied to the CMOS transistor switch 90, the on resistance $R_{ON}$ still varies, as shown by a change in on resistance $\Delta R_{ON}$ 122 around the direct current (DC) component 124 of the input (source) signal 58. Although the $\Delta R_{ON}$ 122 may be lower than that of either one of NMOS transistor 92 and PMOS transistor 94 individually, the $\Delta R_{ON}$ 122 is non-zero, and thus may still introduce some distortion.

Figure 11:
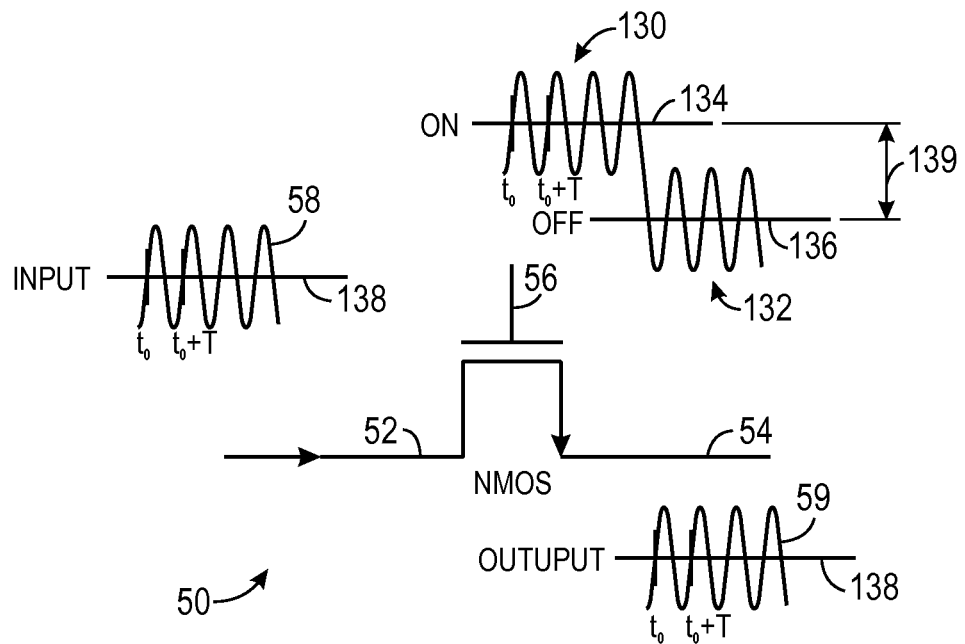
FIG. 11 is a circuit diagram illustrating a manner of maintaining a substantially constant on resistance $R_{ON}$ of the NMOS transistor switch by supplying a gate terminal of the transistor switch with gate activation-deactivation signals that include the same variable voltage component as the input signal, in accordance with an embodiment.

Variation in the on resistance $R_{ON}$ of the NMOS transistor 50 or the CMOS transistor switch 90 may be reduced by providing gate activation-deactivation signals that include the variable voltage component of the input (source) signal 58. For example, as shown in FIG. 11, the NMOS transistor 50 may be activated and deactivated using a gate activation-deactivation signal that includes the same sinusoidal component as the input (source) signal 58. At some first time, the gate terminal 56 of the NMOS transistor 50 may be supplied with an "ON" gate activation-deactivation signal 130 that causes the transistor 50 to enter an "ON" state. At some second time, the gate terminal 56 of the NMOS transistor 50 may be supplied with an "OFF" gate activation-deactivation signal 132 that causes the transistor 50 to enter an "OFF" state. Both of these signals include the same variable voltage component as the input (source) signal 58.

Indeed, as seen in FIG. 11, the "ON" gate activation-deactivation signal 130 includes the variable voltage component (here, a sinusoidal component) of the input (source) signal 58 superposed on an activation direct current (DC) voltage component 134. The "OFF" gate activation-deactivation signal 132 includes the variable voltage component of the input (source) signal 58 superposed on a deactivation direct current (DC) voltage component 136. The input (source) signal 58 may be understood to be the variable voltage component (here, the sinusoidal component) superposed on an input direct current (DC) voltage component 138. Because the signals 58, 130, and 132 all include the same variable voltage component, the only differences between the input (source) signal 58 and the gate activation-deactivation signals 130 and 132 are direct current (DC) voltage differences. As such, the difference between the activation direct current (DC) voltage component 134 and the input direct current (DC) voltage component 138 may remain substantially constant while the "ON" gate activation-deactivation signal 130 is being applied. Likewise, the difference between the deactivation direct current (DC) voltage component 136 and the input direct current (DC) voltage component 138 may remain substantially constant while the "OFF" gate activation-deactivation signal 132 is being applied.

Figure 12:
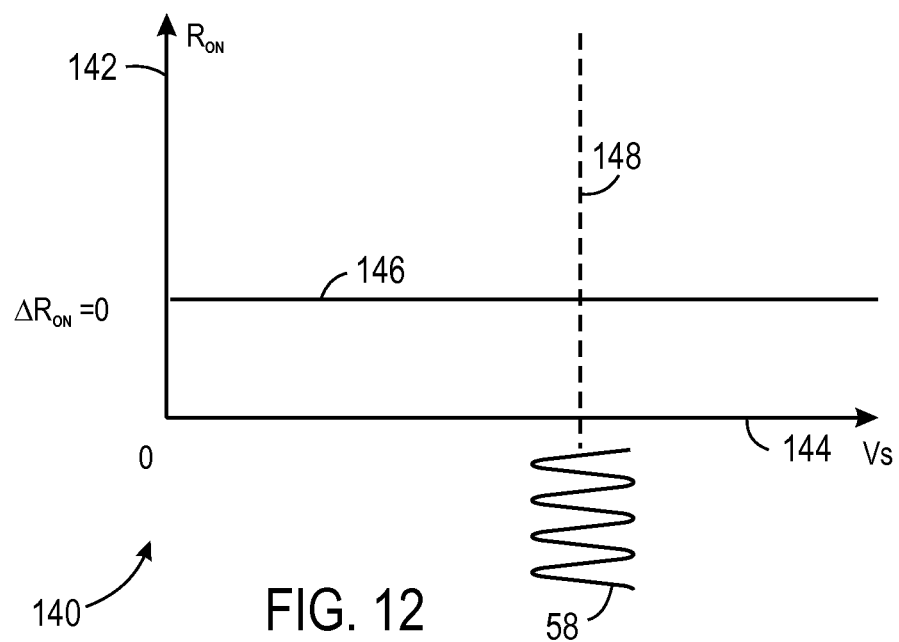
FIG. 12 is a plot of the on resistance $R_{ON}$ of the NMOS transistor under the conditions of FIG. 11, in accordance with an embodiment.

The constancy of the difference between the activation direct current (DC) voltage component 134 and the input direct current (DC) voltage component 138 may result in a substantially constant on resistance $R_{ON}$. This is represented in a plot 140 of FIG. 12. In the plot 140, the on resistance $R_{ON}$ (ordinate 142) is compared against the input (source) voltage Vs (abscissa 144) when the "ON" gate activation-deactivation signal 130 is applied to the gate terminal 56 of the NMOS transistor 50. Since the "ON" gate activation-deactivation signal 130 includes substantially the same variable voltage component as the input (source) signal Vs, the alternating current (AC) variations of the input (source) signal Vs cancel each other out, and thus do not cause changes over time to the on resistance $R_{ON}$. Thus, the on resistance $R_{ON}$ difference ($\Delta R_{ON}$), as shown by a curve 146, remains substantially 0 around the signal center 148 of the input (source) signal 58.

Because the on resistance $R_{ON}$ remains constant despite swings in the voltage of the input (source) signal 58, the otherwise non-linear NMOS transistor 50 exhibits a highly linear behavior. Indeed, the relationship between the on resistance $R_{ON}$ and the input (source) signal 58 may be substantially irrelevant. The thin film transistor layout of the NMOS transistor 50 may be much smaller than otherwise. Moreover, the NMOS transistor 50 may be designed to be optimized for substantially only one direct current (DC) voltage component bias, rather than a range of voltages. Having a smaller transistor switch size correspondingly may lower switch parasitic capacitances, such as the capacitance from gate to source ($C_{gs}$) and a parasitic capacitance from gate to drain ($C_{gd}$). This structure may also avoid additional charging capacitors that could consume additional energy. In addition, there may be relatively low distortion at the output terminal 54 of the NMOS transistor 50 because the on resistance $R_{ON}$ remains constant even despite relatively great swings in the input (source) signal 58.

Comparable techniques may be used to control the CMOS transistor switch 90 to maintain a substantially constant on resistance $R_{ON}$, as shown in FIG. 13. The NMOS transistor 92 of the CMOS transistor switch 90 may be operated in the same way as the NMOS transistor 50. That is, at some first time, the gate terminal 100 of the NMOS transistor 92 may be supplied with the gate activation-deactivation signal 130, which causes the transistor 92 to enter an "ON" state. At some second time, the gate terminal 100 of the NMOS transistor 92 may be supplied with a gate activation-deactivation signal 132, which causes the transistor 92 to enter an "OFF" state. The PMOS transistor 94 of the CMOS transistor switch 90 may be operated in a complementary manner to the NMOS transistor 92. At the first time, the gate terminal 106 of the PMOS transistor 94 may be supplied with the gate activation-deactivation signal 132, which causes the transistor 94 to enter an "ON" state. At the second time, the gate terminal 106 of the PMOS transistor 94 may be supplied with the gate activation-deactivation signal 130, which causes the transistor 92 to enter an "OFF" state.

In FIG. 13, as in FIG. 11, the difference between the activation direct current (DC) voltage component 134 and the input direct current (DC) voltage component 138 may remain substantially constant while the gate activation-deactivation signal 130 is being applied. Likewise, the difference between the deactivation direct current (DC) voltage component 136 and the input direct current (DC) voltage component 138 may remain substantially constant while the gate activation-deactivation signal 132 is being applied. As seen in FIG. 14, this may result in a substantially constant on resistance $R_{ON}$. In a plot 170 of FIG. 14, the on resistance $R_{ON}$ (ordinate 172) is compared against the input (source) voltage Vs (abscissa 174) when the gate activation-deactivation signals 130 and 132 are applied to the gate terminals 100 and 106, respectively. Since the gate activation-deactivation signals 130 and 132 include substantially the same variable voltage component as the input (source) signal 58, the alternating current (AC) variations of the input (source) signal Vs and the signals 130 and 132 cancel each other out, and thus do not cause changes over time to the on resistance $R_{ON}$. Thus, the on resistance $R_{ON}$ difference ($\Delta R_{ON}$), as shown by a curve 176, remains substantially 0 around the signal center 178 of the input (source) signal 58.

Any suitable circuitry may carry out the transistor control described above with reference to FIGS. 11-14. One example of circuitry to control the NMOS transistor 50 appears as control circuitry 180 in FIG. 15. The control circuitry 180 may control the NMOS transistor 50 to maintain a substantially constant on resistance $R_{ON}$ despite receiving the input signal 58, which includes a variable voltage component. The input signal 58 may be any suitable signal that exhibits non-DC behavior over at least the period of time while the input signal will be switched through the NMOS transistor 50. For instance, the input signal 58 may be a regular signal (e.g., a sinusoid, squarewave, or a sawtooth signal, to name a few examples) or may be an irregular signal (e.g., a random or non-repeating signal).

Figure 15:
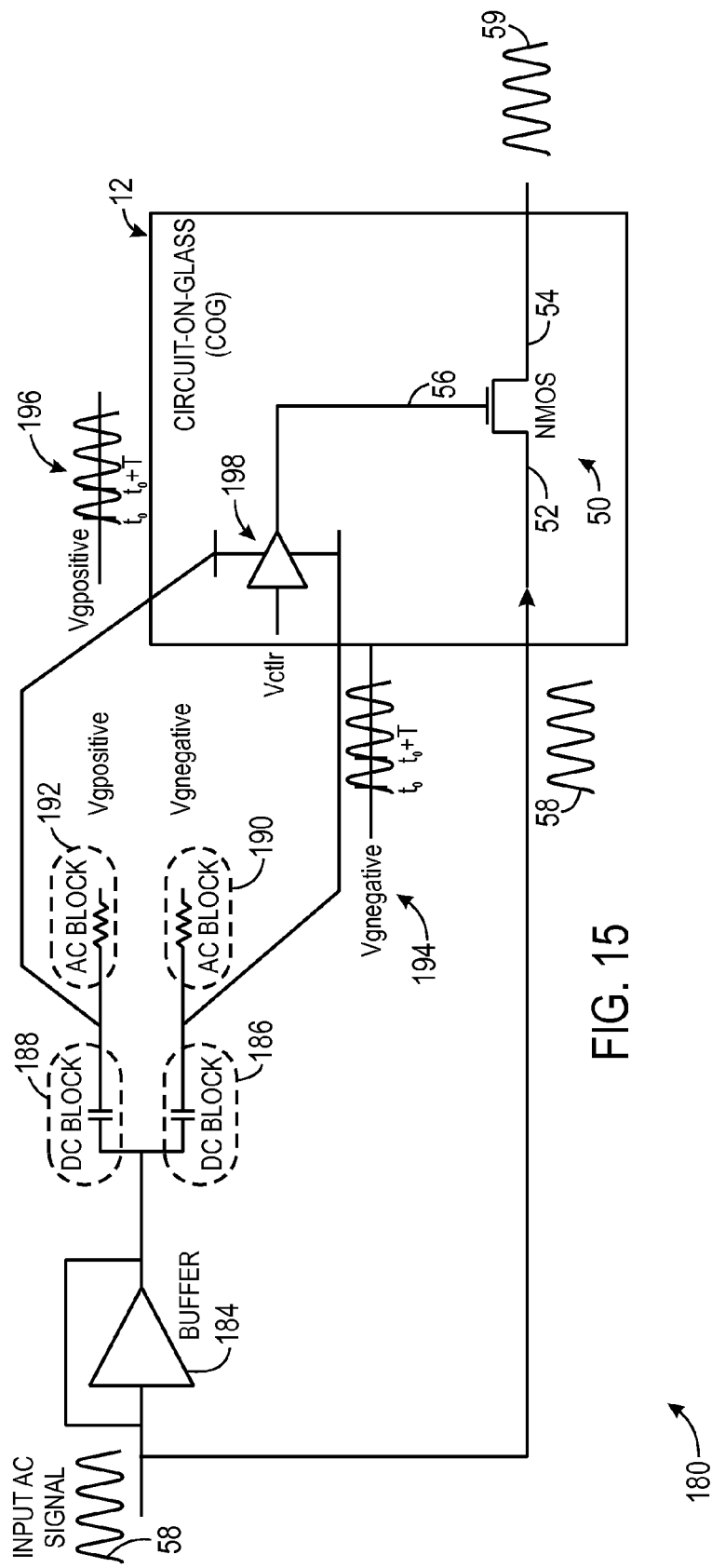
FIG. 15 is an example of circuitry that may control the NMOS transistor switch to maintain a substantially constant on resistance $R_{ON}$ even while an input signal having a variable voltage component is passed through the transistor switch, in accordance with an embodiment.

The input signal 58 may be supplied to the input (source) terminal 52 of the NMOS transistor 50, which is shown in FIG. 15 as a circuit-on-glass (COG) transistor on the display 12. Meanwhile, the input (source) signal 58 may be passed through a buffer 184 to other circuitry that may extract the variable voltage component of the input (source) signal 58. Any suitable direct-current-blocking (DC-blocking) circuitry 186 and/or 188, such as one or more capacitive elements, may allow only the variable voltage component of the input signal 58 to pass through to be added to certain various direct current voltages. In the example of FIG. 15, alternating-current-blocking (AC-blocking) circuitry 190 and/or 192 coupled to voltage sources Vgnegative and Vgpositive may ensure that substantially only direct current (DC) components of these voltages are received. The AC-blocking circuitry 190 and/or 192 may represent, for example, resistive and/or an inductive elements. The AC-blocking circuitry 190 may permit only a direct current (DC) value of Vgnegative to be added to the variable voltage component of the input (source) signal 58. The AC-blocking circuitry 192 may permit only a direct current (DC) component value of Vgpositive to be added to the variable voltage component of the input (source) signal 58.

The resulting Vgnegative signal 194 and Vgpositive signal 196 may include the same variable voltage component as the input (source) signal 58, and substantially correspond to the gate activation-deactivation signals 132 and 130, respectively. The Vgnegative signal 194 and the Vgpositive signal 196 may be supplied to an activation signal switching device 198 (e.g., an amplifier 198), which is shown in FIG. 15 to be controlled by a control signal $V_{ctrl}$. When the control signal $V_{ctrl}$ has a first value (e.g., a logic high or logic low), the activation signal switching device 198 may supply the Vgpositive signal 196 to cause the NMOS transistor 50 to activate and permit the input (source) signal 58 to pass through the NMOS transistor 50 to be output as an output signal 59.

In the example shown in FIG. 15, the NMOS transistor 50 is a circuit-on-glass (COG) transistor that may be formed from, for example, a polysilicon material. As a result, the on resistances $R_{ON}$ characteristics of the NMOS transistor 50 may change relatively sharply with changes in the input (source) signal $V_s$ relative to the gate activation-deactivation signal. Since the gate activation-deactivation signal includes the variable voltage component of the input signal 58, however, the difference between the gate and input (source) signal ($V_{gs}$) is maintained at a first constant DC voltage when the NMOS transistor 50 is switched on and at a second constant DC voltage when the NMOS transistor 50 is switched off.

In certain embodiments, the switching device 198 includes transistor components that are themselves activated with constant direct current (DC) gate activation values. As such, as discussed above with reference to FIGS. 7-10, the size of the transistors of the switching device 198 may be sufficiently large to produce a substantially negligible change in on resistance $R_{ON}$ within the transistors that are internal to the switching device 198. The switching device 198 may be located, however, in an area of the display 12 where the larger size of those component transistors may be acceptable. Additionally or alternatively, the amplifier 198 may be disposed in different circuitry not part of the circuit-on-glass (COG) circuitry of the electronic display 12. For example, the switching device 198 may be located in display driver circuitry located in the electronic display 12 or elsewhere in the electronic device 10 (e.g., in processor(s) 18). Additionally or alternatively, the switching device 198 may be formed from different materials than the transistor 50 located on the COG circuitry of the display 12, whether the switching device 198 is located on the COG circuitry or not. In one particular example, the switching device 198 may be located apart from the COG circuitry and may be formed from a material other than polysilicon and the transistor 50 may be located on the COG circuitry and may be formed based on polysilicon.

Figure 16:
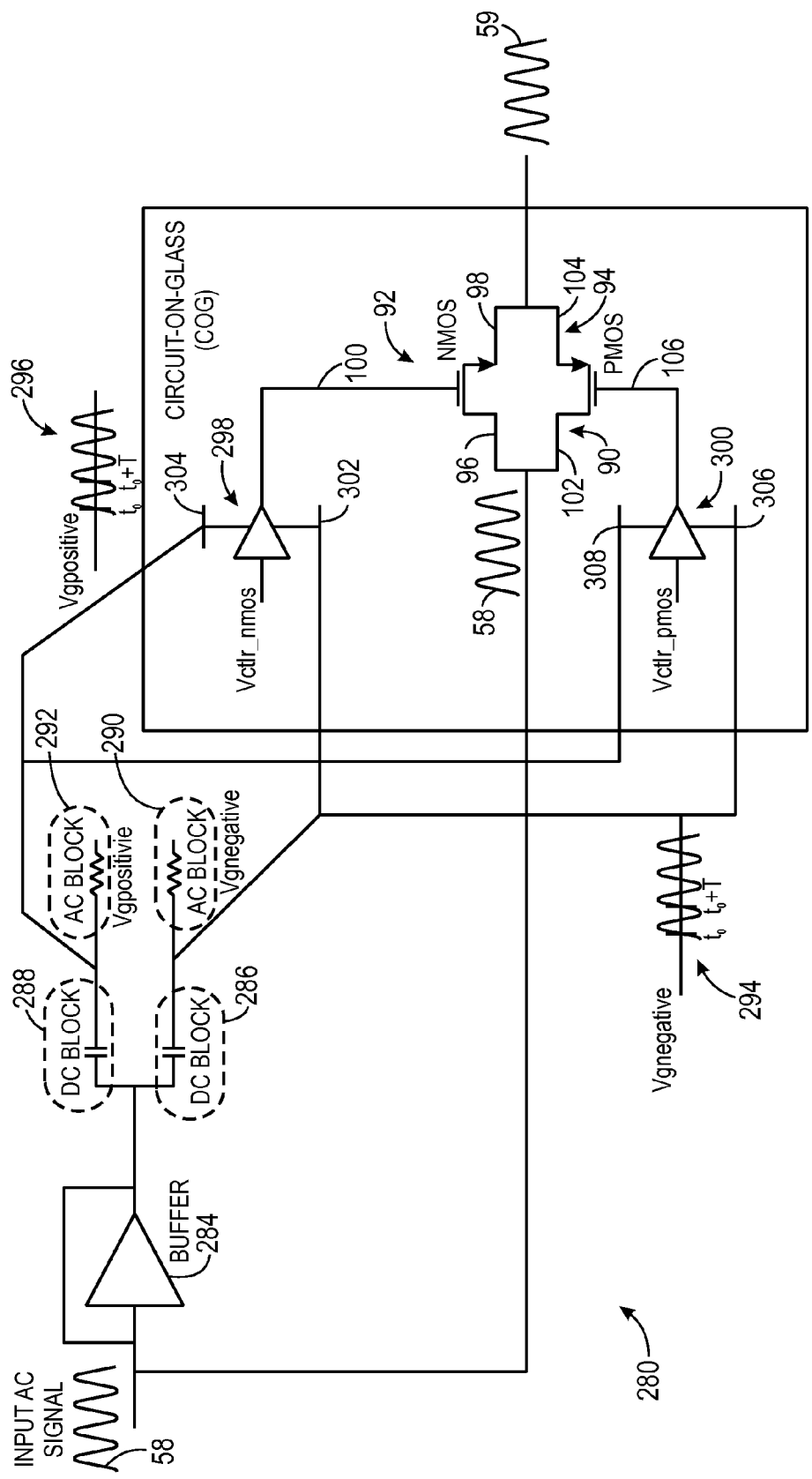
FIG. 16 is an example of circuitry that may control the CMOS transistor switch to maintain a substantially constant on resistance $R_{ON}$ even while an input signal having a variable voltage component is passed through the transistor switch, in accordance with an embodiment.

An example of circuitry to control the CMOS transistor switch 90 appears as control circuitry 280 in FIG. 16. The control circuitry 280 may control the CMOS transistor switch 90 to maintain a substantially constant on resistance $R_{ON}$ despite receiving the input signal 58, which includes a variable voltage component. As discussed above, the input signal 58 may be any suitable signal that exhibits non-DC behavior over at least the period of time that the input signal will be switched through the CMOS transistor switch 90. For instance, the input signal 58 may be a regular signal (e.g., a sinusoid, squarewave, or a sawtooth signal, to name a few examples) or may be an irregular signal (e.g., a random or non-repeating signal).

The input signal 58 may be supplied to the input (source) terminal 96 of the NMOS transistor 92 and the input (source) terminal 102 of the PMOS transistor 94 of the CMOS transistor switch 90, which is shown in FIG. 16 as a circuit-on-glass (COG) complementary transistor pair. Meanwhile, the input (source) signal 58 may be passed through a buffer 284 to other circuitry that may extract the variable voltage component of the input (source) signal 58. Any suitable direct-current-blocking (DC-blocking) circuitry 286 and/or 288, such as one or more capacitive elements, may allow only the variable voltage component of the input signal 58 to pass through to be added to certain various direct current voltages. In the example of FIG. 16, alternating-current-blocking (AC-blocking) circuitry 290 and/or 292 coupled to voltage sources Vgnegative and Vgpositive may ensure that substantially only direct current (DC) components of these voltages are received. The AC-blocking circuitry 290 and/or 292 may represent, for example, resistive and/or an inductive elements. The AC-blocking circuitry 290 may permit only a direct current (DC) component value of Vgnegative to be added to the variable voltage component of the input (source) signal 58. The AC-blocking circuitry 292 may permit only a direct current (DC) component value of Vgpositive to be added to the variable voltage component of the input (source) signal 58.

The resulting Vgnegative signal 294 and Vgpositive signal 296 may include the same variable voltage component as the input (source) signal 58, and substantially correspond to the gate activation-deactivation signals 132 and 130, respectively. The Vgnegative signal 294 and the Vgpositive signal 296 may be supplied to activation signal switching devices 298 and 300 (e.g., amplifiers), which are shown in FIG. 16 to be controlled by control signals $V_{ctrl\_nmos}$ and $V_{ctrl\_pmos}$ respectively. When these control signals are first values (e.g., a logic high or logic low), the activation signal switching device 298 may supply the Vgpositive signal 296 to cause the NMOS transistor 92 to activate and permit the input (source) signal 58 to pass through the NMOS transistor 92 to be output as an output signal 59. The activation switching device 300 may correspondingly supply the Vgnegative signal 294 to cause the PMOS transistor 94 to activate and permit the input (source) signal 58 to pass through the PMOS transistor 94 to be output as the output signal 59. With different control signals (e.g., a logic low or logic high), the activation signal switching devices 298 and 300 may supply the opposite gate activation-deactivation signals to the gate terminals 100 and 106, causing the NMOS transistor 92 and the PMOS transistor 94 to stop passing the input (source) signal through to the output (drain) terminals 98 and 104.

In the example shown in FIG. 16, the CMOS transistor switch 90 may maintain a relatively constant on resistance $R_{ON}$ because the gate activation-deactivation signals include the variable voltage component of the input signal 58. It should be appreciated that the switching devices 298 and 300 may take any suitable form and/or disposition, including those discussed above with reference to the switching device 198.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method comprising:
   supplying a first signal to an input terminal of a transistor switch, wherein the first signal comprises a first direct current component and a first alternating current component;
   at a first time, activating the transistor switch by supplying a second signal to a gate terminal of the transistor switch, wherein the second signal comprises a second direct current component and the first alternating current component, wherein a difference between the second direct current component and the first direct current component is sufficient to activate the transistor switch to allow the first signal to pass through a channel of the transistor switch to an output terminal of the transistor switch; and at a second time, deactivating the transistor switch by supplying a third signal to the gate terminal of the transistor switch, wherein the third signal comprises a third direct current component and the first alternating current component, wherein a difference between the third direct current component and the first direct current component is sufficient to deactivate the transistor switch to prevent the first signal from passing through the channel of the transistor switch to the output terminal of the transistor switch;

wherein, while the first signal is being supplied to the input terminal of the transistor switch, substantially the only voltage difference between the first signal and the second signal is the difference between the second direct current component and the first direct current component and substantially the only voltage difference between the first signal and the third signal is the difference between the third direct current component and the first direct current component, thereby causing one or more characteristics of the channel of the transistor switch to remain substantially constant while the channel is allowing the first signal to pass.

2. The method of claim 1, wherein the first signal is supplied to the input terminal of the transistor switch, wherein the transistor switch comprises a circuit-on-glass thin film transistor on a display panel of an electronic display.

3. The method of claim 2, comprising, using circuitry not disposed on the display panel, extracting the first alternating current component of the first signal and adding the first alternating current component to the second direct current component to obtain the second signal and to the third direct current component to obtain the third signal.

4. The method of claim 2, comprising receiving the second signal and the third signal into switching circuitry disposed on the display panel of the electronic display and switching the second signal to the gate terminal at the first time and switching the third signal to the gate terminal at the second time.

5. The method of claim 2, comprising receiving the second signal and the third signal into switching circuitry disposed outside of the display panel of the electronic display and switching the second signal to a circuit-on-glass connection to the gate terminal at the first time and switching the third signal to the circuit-on-glass connection to the gate terminal at the second time.

6. The method of claim 1, wherein the first alternating current component comprises a signal that has substantially non-direct-current characteristics at least over a period between the first time and the second time.

7. The method of claim 1, wherein the one or more characteristics of the channel of the transistor switch comprise an on resistance.

8. An electronic display comprising:
a thin film transistor switch comprising an input terminal, an output terminal, and a gate terminal; and
driving circuitry configured to: supply a first signal to the input terminal of the thin film transistor switch, wherein the first signal comprises a first direct current component and a first alternating current component; at a first time, activating the thin film transistor switch by supplying a second signal to the gate terminal of the thin film transistor switch, wherein the second signal comprises a second direct current component and the first alternating current component, wherein a difference between the second direct current component and the first direct current component is sufficient to activate the thin film transistor switch to allow the first signal to pass through a channel of the thin film transistor switch to the output terminal of the thin film transistor switch; and at a second time, deactivating the thin film transistor switch by supplying a third signal to the gate terminal of the thin film transistor switch, wherein the third signal comprises a third direct current component and the first alternating current component, wherein a difference between the third direct current component and the first direct current component is sufficient to deactivate the thin film transistor switch to prevent the first signal from passing through the channel of the thin film transistor switch to the output terminal of the thin film transistor switch; wherein, while the first signal is being supplied to the input terminal of the thin film transistor switch, substantially the only voltage difference between the first signal and the second signal is the difference between the second direct current component and the first direct current component and substantially the only voltage difference between the first signal and the third signal is the difference between the third direct current component and the first direct current component, thereby causing one or more characteristics of the channel of the thin film transistor switch to remain substantially constant while the channel is allowing the first signal to pass.

9. The electronic display of claim 8, wherein the thin film transistor switch is disposed on a display panel of the electronic display.

10. The electronic display of claim 9, wherein the driving circuitry is substantially not disposed on the display panel of the electronic display.

11. The electronic display of claim 9, wherein the driving circuitry comprises an amplifier switch configured to alternatingly supply the gate terminal with the second signal and the third signal, wherein the amplifier switch is disposed on the display panel of the electronic display.

12. The electronic display of claim 9, wherein the driving circuitry comprises an amplifier switch configured to alternatingly supply the gate terminal with the second signal and the third signal, wherein the amplifier switch is disposed outside of the display panel of the electronic display.

13. The electronic display of claim 8, wherein the thin film transistor switch comprises a polysilicon substrate configured to produce an on resistance with greater variability per change in gate-to-source voltage than single-crystal silicon.

14. The electronic display of claim 8, wherein the thin film transistor switch comprises only one NMOS transistor or only one PMOS transistor.

15. The electronic display of claim 8, wherein a difference between the third direct current component and the first direct current component is less than a threshold voltage of the thin film transistor switch.

16. A method for controlling a CMOS transistor switch that receives an input signal with a first alternating current component and a first direct current component, the method comprising:
providing the input signal to an input terminal of the CMOS transistor switch;
extracting the first alternating current component from the input signal;

adding a second direct current component to the extracted first alternating current component to produce a first gate activation-deactivation signal;

adding a third direct current component to the extracted first alternating current component to produce a second gate activation-deactivation signal; and activating the CMOS transistor switch by providing the first gate activation-deactivation signal to an NMOS transistor of the CMOS transistor switch and providing the second gate activation-deactivation signal to a PMOS transistor of the CMOS transistor switch to permit the input signal to pass through to an output terminal of the CMOS transistor switch.

17. The method of claim 16, comprising deactivating the CMOS transistor switch by providing the second gate activation-deactivation signal to the NMOS transistor of the CMOS transistor switch and providing the first gate activation-deactivation signal to the PMOS transistor of the CMOS transistor switch to prevent the input signal from passing through to the output terminal of the CMOS transistor switch.

18. The method of claim 16, wherein, when the CMOS transistor switch is activated:

substantially the only difference between the input signal and the first gate activation-deactivation signal is the difference between the first direct current component and the second direct current component, wherein the difference between the first direct current component and the second direct current component is sufficient to activate the NMOS transistor with a substantially uniform on resistance; and substantially the only difference between the input signal and the second gate activation-deactivation signal is the difference between the first direct current component and the third direct current component, wherein the difference between the first direct current component and the third direct current component is sufficient to activate the PMOS transistor with a substantially uniform on resistance.

19. The method of claim 18, wherein, when the CMOS transistor switch is deactivated:

substantially the only difference between the input signal and the first gate activation-deactivation signal is the difference between the first direct current component and the second direct current component, wherein the difference between the first direct current component and the second direct current component is sufficient to deactivate the PMOS transistor; and substantially the only difference between the input signal and the second gate activation-deactivation signal is the difference between the first direct current component and the third direct current component, wherein the difference between the first direct current component and the third direct current component is sufficient to deactivate the NMOS transistor.

* * * * *